United States Patent
Shimozono et al.

(10) Patent No.: US 6,746,939 B2
(45) Date of Patent: Jun. 8, 2004

(54) PRODUCTION METHOD FOR SOLID IMAGING DEVICE

(75) Inventors: Takayuki Shimozono, Kagoshima (JP); Ritsuo Takizawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/333,640

(22) PCT Filed: May 22, 2002

(86) PCT No.: PCT/JP02/04927
§ 371 (c)(1),
(2), (4) Date: May 5, 2003

(87) PCT Pub. No.: WO02/095830
PCT Pub. Date: Nov. 28, 2002

(65) Prior Publication Data
US 2003/0170928 A1 Sep. 11, 2003

(51) Int. Cl.$^7$ .................. H01L 21/425; H01L 21/322
(52) U.S. Cl. .................. 438/471; 438/60; 438/75; 438/473; 438/476; 438/477; 438/526; 257/215; 257/227; 148/33.2
(58) Field of Search ............... 148/33, 33.2; 438/16, 438/17, 48, 57, 60, 473, 526, 913, 918, 41, 44, 69, 78, 471, 477; 257/215, 227

(56) References Cited

U.S. PATENT DOCUMENTS

| | | | |
|---|---|---|---|
| 5,734,195 A | | 3/1998 | Takizawa |
| 5,874,348 A | * | 2/1999 | Takizawa et al. ............ 438/473 |
| 6,342,436 B1 | * | 1/2002 | Takizawa .................. 438/473 |
| 6,478,883 B1 | * | 11/2002 | Tamatsuka et al. ........ 148/33.2 |
| 6,635,950 B1 | * | 10/2003 | Ishida et al. ................. 257/607 |

FOREIGN PATENT DOCUMENTS

| | | |
|---|---|---|
| JP | 04-101428 | 4/1992 |
| JP | 06-338507 | 12/1994 |
| JP | 06-338605 | 12/1994 |
| JP | 07-106544 | 4/1995 |
| JP | 09-148553 | 6/1997 |
| JP | 10-092812 | 4/1998 |
| JP | 11-204771 | 7/1999 |

* cited by examiner

Primary Examiner—Matthew Smith
Assistant Examiner—Calvin Lee
(74) Attorney, Agent, or Firm—Sonnenschein, Nath & Rosenthal LLP

(57) ABSTRACT

White defects caused by a dark-current of a solid-state imaging device is reduced by effectively bringing out gettering capability of a buried getter sink layer. A buried getter sink layer is formed by introducing to the semiconductor substrate a substance of a second element which is a congener of a first element composing a semiconductor substrate, a crystal growth layer is formed by crystal growing a substance of the first element on a surface of the semiconductor substrate, and a solid-state imaging element is formed inside and on the crystal growth layer at a lower temperature than that in the case of forming an extrinsic getter sink layer by introducing a substance of a third element of a different group from the first element on a back surface of the semiconductor substrate. Alternately, a solid-state imaging element is formed at a lower temperature than that in the case of forming an extrinsic getter sink layer on a surface of the crystal growth layer by oxidization in an atmosphere of a gas containing hydrochloric acid.

7 Claims, 8 Drawing Sheets

10: SEMICONDUCTOR SUBSTRATE
12: BURIED GETTER SINK LAYER
13: CRYSTAL GROWTH LAYER

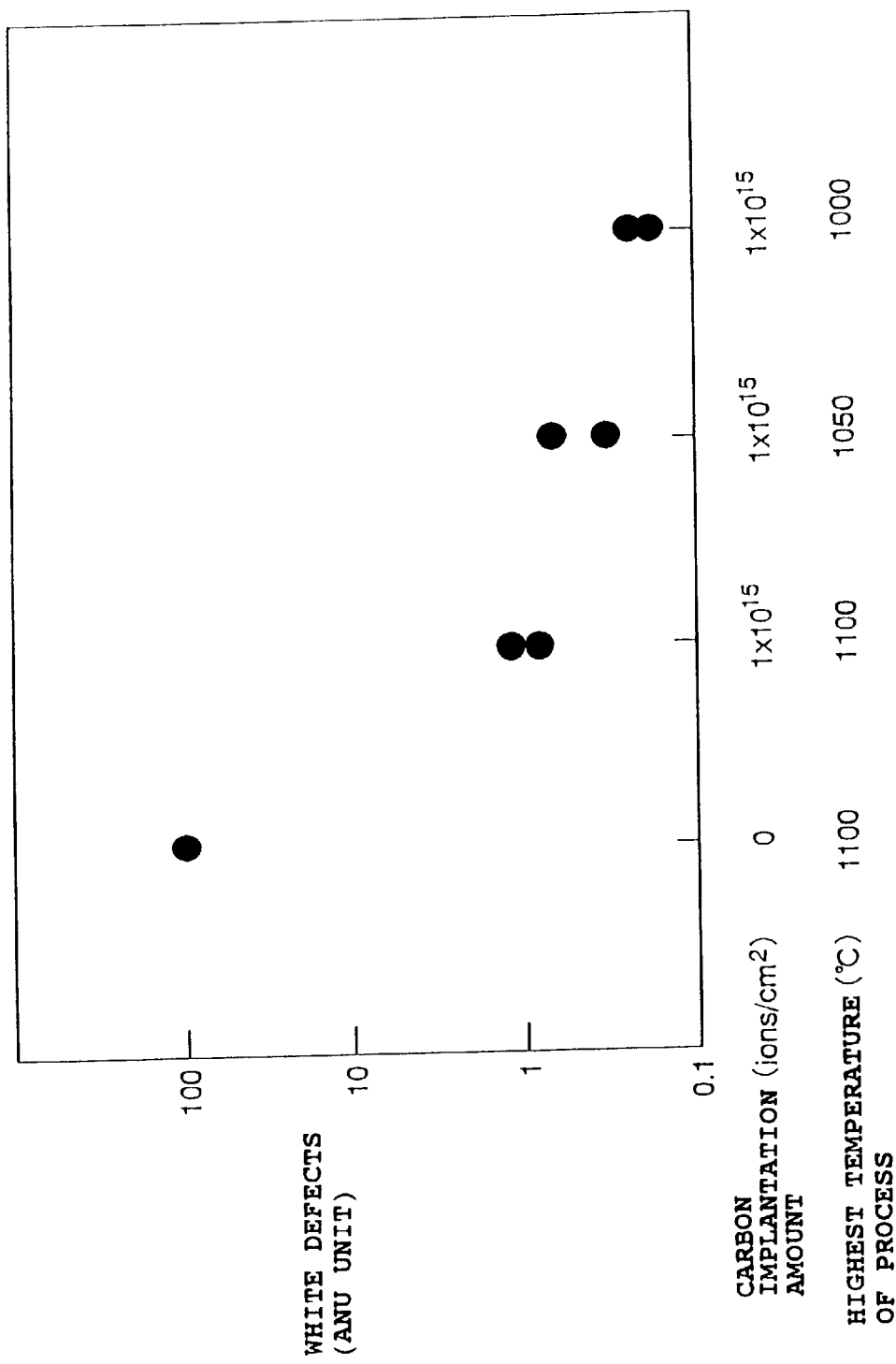

PRODUCTION METHOD FOR SOLID IMAGING DEVICE

BACKGROUND OF THE INVENTION

The present invention relates to a method of producing a solid-state imaging device having a buried getter sink layer formed by introducing a substance of a congener of an element of a semiconductor substrate, such as carbon, to a silicon substrate, on which a crystal growth layer is formed, and a solid-state imaging element is formed in and on the crystal growth layer.

Particularly, the present invention relates to a method of producing a solid-state imaging device wherein white defects are reduced by improving a gettering capability of a buried getter sink layer for gathering impurities which contaminate the crystal growth layer to areas other than element formation regions.

As a semiconductor substrate for being formed a semiconductor element, generally a CZ substrate grown by the CZ (Czochralski) method, an MCZ substrate grown by the MCZ (Magnetic field Czochralski) method, and an epitaxial substrate wherein an epitaxial layer is formed on a surface of the CZ substrate or MCZ substrate, etc. are often used.

Particularly, the epitaxial substrate and the MCZ substrate are mainly used for a solid-state imaging device so as to reduce unevenness of image contrast caused by dopant concentration inhomogeneities (dopant striations). Among the above, the epitaxial substrate indicates a substrate provided in advance with an element formation layer (hereinafter, referred to as an epitaxial layer) formed by crystal growth. The epitaxial substrates are capable of reducing series resistance of a lower part than the epitaxial layer by using a low resistance substrate in its formation and/or by forming a low resistance buried region prior to the crystal growth. Therefore, when using the epitaxial substrate, a drive voltage for bringing a desired change of energy barrier height in an element and an application voltage to a substrate are reduced, which is advantageous to a reduction of power consumption. Accordingly, a solid-state imaging device using an epitaxial substrate is expected to be in wider use in the future.

The Chemical Vapor Deposition (CVD) is used as a practical method for forming a silicon epitaxial substrate. The CVD is performed by the hydrogen reduction method using $SiCl_4$ or $SiHCl_3$ as a source gas, or the pyrolysis method using $SiH_2Cl_2$ or $SiH_4$ as a source gas.

Reactions of using the above main four kinds of source gases are indicated below.

(Hydrogen Reduction Method)

$$SiCl_4 + 2H_2 \rightarrow Si + 4HCl \quad (1)$$

$$SiHCl_3 + H_2 \rightarrow Si + 3HCl \quad (2)$$

(Pyrolysis Method)

$$SiH_2Cl_2 \rightarrow Si + 2HCl \quad (3)$$

$$SiH_4 \rightarrow Si + 2H_2 \quad (4)$$

From the above, a substrate formed by using $SiHCl_3$ as a source gas is mainly used for solid-state imaging element because the source gas is inexpensive and suitable to formation of a thick epitaxial layer of a high growing speed, etc.

However, even in a case of forming an epitaxial substrate by using any of the above source gases, a large amount of contaminating impurities, particularly metal impurities or heavy metal impurities, are mixed in during formation of the epitaxial layer. Accordingly, when forming a solid-state imaging element by using the epitaxial substrate, the metal impurities, etc. contained in the substrate cause an increase of a dark-current of the solid-state imaging element and white defects (white spots in the dark) arises much in the solid-state imaging element. Therefore, characteristics and yield thereof decline.

Stainless (SUS) based parts in a bell jar of the epitaxial growth apparatus and piping of a source gas are considered as sources to generate heavy metal impurities. When a chloride (Cl) gas is included in the source gas, the gas is decomposed at the time of epitaxial growing to generate hydrogen chloride (HCl). It is considered that as a result that the HCl corrodes the SUS based parts, metal chlorides are taken into the source gas and further into the epitaxial layer.

Also, prior to forming the epitaxial layer, a HCl gas is intentionally introduced to lightly etch off the surface of the silicone substrate on an object of cleaning the same in some cases, but the HCl is also a part of reasons of corroding the SUS based parts, etc.

Therefore, when forming a solid-state imaging element by using an epitaxial substrate, some kind of gettering technique is necessary for removing metal impurities mixed in as explained above. As the gettering technique, there are the Intrinsic Gettering (IG) by which an oxide of oxygen and silicon included in the silicon substrate is deposited only inside the substrate to be used as a getter sink and the Extrinsic Gettering (EG) by which polycrystalline silicon or concentrated phosphorous (P) regions, etc. is formed on the back surface of the substrate and a getter sink is formed by using a strain stress with silicon. However, neither of the above methods was sufficiently capable as a gettering method and was not able to sufficiently reduce white defects caused by a dark-current of a solid-state imaging element.

To reduce the white defects as above, the present inventors have proposed a technique of, for example, performing ion implantation of a congener element of a silicone substrate, such as carbon, on one surface of the substrate by a doze of $5 \times 10^{13}$ ions/$cm^2$ or more and forming an epitaxial layer of silicon on its surface in the Japanese Unexamined Patent Publication No. 6-338507.

According to the method, white defects of a solid-state imaging device is reduced to ⅕ or less comparing with that in the case of an epitaxial substrate using a conventional gettering method.

FIG. 1 shows a reduction of white defects of the solid-state imaging device according to the method described in the Japanese Unexamined Patent Publication No. 6-338507, wherein the number of white defects was standardized by assuming the number of white defects when not performing ion implantation to be 1. As shown in FIG. 1, by performing ion implantation of carbon, white defects widely reduce when a doze of carbon is $5 \times 10^{13}$ ions/$cm^2$ or so and further reduce when a doze of carbon is $5 \times 10^{13}$ ions/$cm^2$ or more, for example, raised to $5 \times 10^{14}$ ions/$cm^2$.

Note that when a doze of carbon exceeds $5 \times 10^{15}$ ions/$cm^2$, the crystallinity of a mirror surface of the substrate and a silicon epitaxial layer grown thereon are reduced.

From the above, in the Japanese Unexamined Patent Publication No. 6-338507, there is described that a range of $5 \times 10^{13}$ to $5 \times 10^{15}$ ions/$cm^2$ is preferable as a doze of carbon.

However, along with the solid-state imaging devices getting highly sensitive, a further reduction of white defects has been desired and a necessity of further improvement of the above conventional method has risen.

SUMMARY OF THE INVENTION

The present invention was made in consideration of the above problem and has as an object thereof to provide a method of producing a solid-state imaging device to reduce white defects caused by a dark-current by effectively bringing out an ability of gettering contaminating impurities mixed in during formation of a crystal growth layer for forming a solid-state imaging element, for example, for a buried gettering layer formed by introducing carbon to a silicon substrate.

To attain the above object, according to a first aspect of the present invention, there is provided a method of producing a solid-state imaging device, including the steps of forming a buried getter sink layer by introducing to a semiconductor substrate a substance of a second element which is a congener of a first element composing the semiconductor substrate, forming a crystal growth layer by crystal growing the substance of the first element on a surface of the semiconductor substrate, and forming a solid-state imaging element in and on the crystal growth layer at a lower temperature than that in the case of forming an extrinsic getter sink layer by introducing a substance of a third element of a different group from the first element to a back surface of the semiconductor substrate.

Preferably, a temperature of all processes to form the solid-state imaging element is lower than 1100° C.

For example, the first element is silicon and the second element is carbon. Also, the third element is phosphorous.

To attain the above object, according to a second aspect of the present invention, there is provided a method of producing a solid-state imaging device, including the steps of forming a buried getter sink layer by introducing to the semiconductor substrate a substance of a second element which is a congener of a first element composing a semiconductor substrate, forming a crystal growth layer by crystal growing the substance of the first element of a surface of the semiconductor substrate, and forming a solid-state imaging element in and on the crystal growth layer at a lower temperature than that in the case of forming an extrinsic getter sink layer on a surface of the crystal growth layer by oxidization in an atmosphere of a gas containing hydrochloric acid.

Preferably, a temperature of all processes to form the solid-state imaging element is lower than 1100° C.

For example, the first element is silicon and the second element is carbon.

In a method of producing a solid-state imaging device as above, a buried getter sink layer is formed by introducing a substance of a congener element to a semiconductor substrate. At this time, for example, carbon C, germanium Ge, tin Sn or lead Pb in the same group IV, for example, ion implanted to, for example, a silicon substrate. In the case of carbon, residual oxygen in the silicon substrate bonds with carbon to generate a compound, which becomes a getter sink. Next, for example, a crystal growth layer of n-type silicon Si is stacked on the semiconductor substrate. Then, the crystal growth layer is formed a variety of impurity regions, and a transfer electrode, light blocking film, filter or lens, etc. are formed on the upper surface of the crystal growth layer, so that a solid-state imaging element is completed.

During thermal processing in a process of forming the solid-state imaging element, for example, heavy metal impurities mixed in at the time of stacking the crystal growth layer are drawn to the above getter sink, consequently, the contamination degree of the crystal growth layer on which the element is formed is lowered.

The present inventors found from experiments that the gettering effect actually declined when a temperature in the processes after forming the crystal growth layer was set too high. Specifically, they obtained a new knowledge that in addition to forming the buried getter sink layer by introducing carbon, etc., when forming other external getter sink layer requiring high temperature processing in parallel therewith, it inhibits the effect of the buried getter sink layer and the gettering effects were not sufficiently obtained as a whole. For example, both of the formation of an external getter sink layer by performing phosphorous diffusion on the back surface of the substrate and formation of an external getter sink layer by performing high temperature oxidization on the surface of the substrate in an atmosphere of chloride contained gas require high temperature processing of 1100° C., and when not forming the external getter sink layer, the gettering effects improve. From the above, in order to sufficiently bring out the effects of the buried getter sink layer by carbon introduction, there was obtained new knowledge that a temperature of processes thereafter had an upper limit.

A method of producing a solid-state imaging device according to the present invention is invented based on the knowledge as above and characterized by forming a solid-state imaging element by setting the temperature lower than that at the time of forming the extrinsic getter sink layer by introducing a substance of a third element of a different group from the above first element to the back surface of the semiconductor substrate, or by setting the temperature lower than that in the case of forming the extrinsic getter sink layer on the surface of the crystal growth layer by oxidizing in an atmosphere of a chloride contained gas. As a result, the gettering effect by introducing a congener element of the semiconductor substrate (for example, carbon) is sufficiently brought out and the contamination degree of the crystal growth layer is furthermore lowered.

BRIEF DESCRIPTION OF DRAWINGS

FIG. 9 is a graph of dependency of the number of white defects on the highest temperature in a process of forming an element when assuming the white defect occurrence rate of a wafer wherein carbon is not implanted is 100.

DETAILED DESCRIPTION OF THE PRESENTLY PREFERRED EMBODIMENTS

Below, a preferred embodiment of a method of producing a solid-state imaging device of the present invention will be explained with reference to the drawings. Here, an example of applying the present invention to a CCD of an interline transfer type will be explained. Other than that, the present invention can be widely applied regardless of a transfer type, such as a frame interline transfer type and a frame transfer type.

Figure 1:
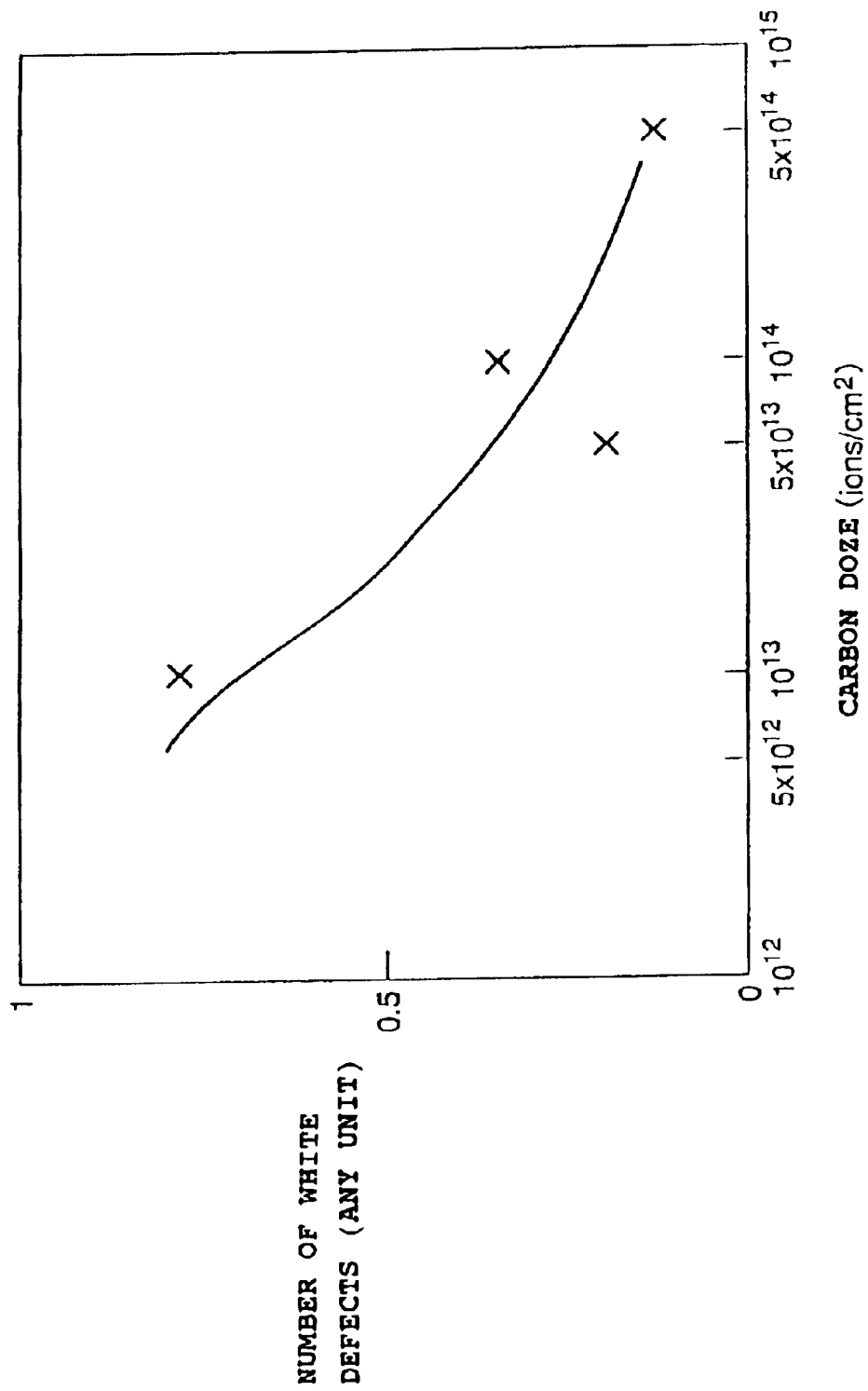
FIG. 1 is a view of a graph of dependency of the number of white defects on a carbon doze, which shows an effect of the related art.
Figure 2:
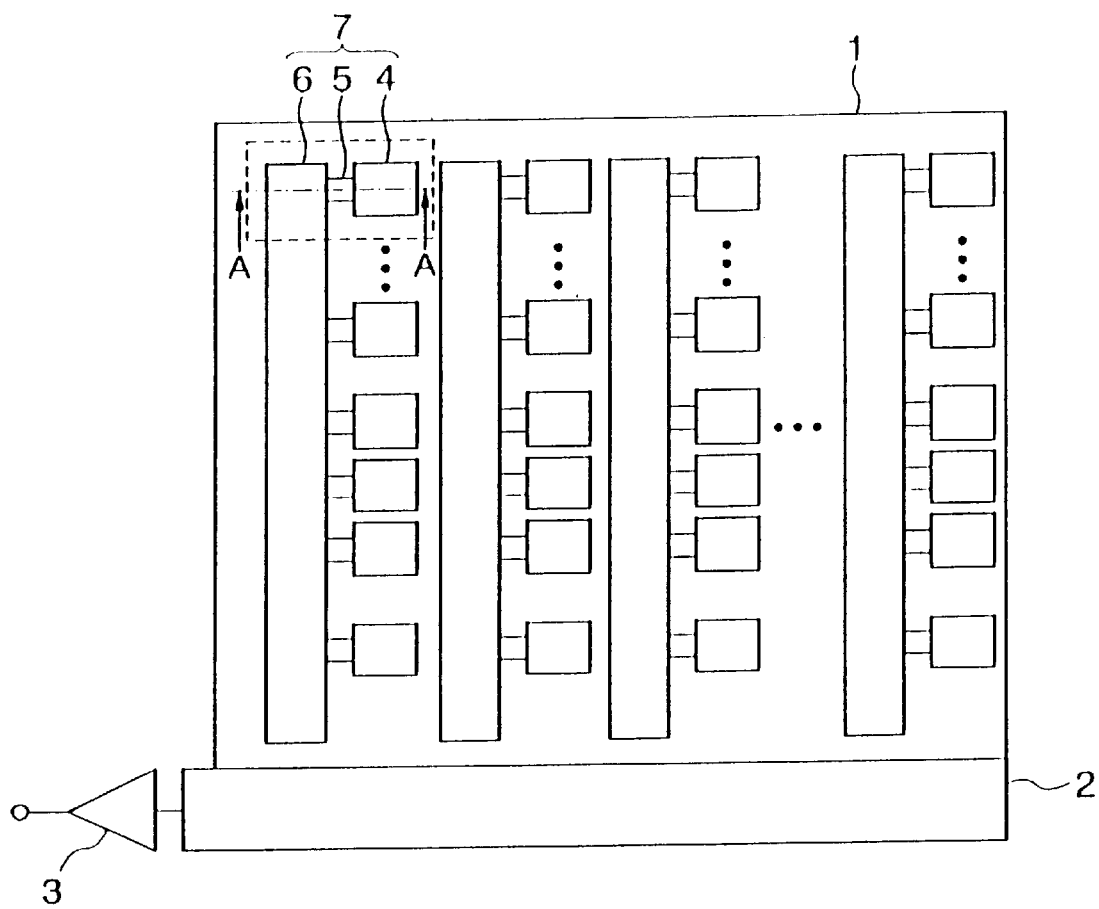
FIG. 2 is a block diagram of the schematic configuration of a CCD according to the present embodiment.

FIG. 2 is a block diagram of the schematic configuration of a CCD according to the present embodiment.

The CCD comprises an imaging portion 1, a horizontal transfer portion 2 and an output portion 3. While not illustrated, the output portion 3 comprises an output gate portion, a charge—voltage converter, for example, composed of a floating gate amplifier or a floating diffusion amplifier, and a reset gate portion.

The imaging portion 1 is configured by arranging in a plane matrix a large number of pixels 7 composed of light receiving portions 4 where photoelectric transfer is performed, a read gate portion 5 and vertical transfer portion 6. Between the pixels 7 are separated so as not to electrically interfere by a not shown channel stop.

The vertical transfer portions 6 are shared in every column of receiving portion 4 and arranged in the row direction by a predetermined number. The imaging portion 1 receives as an input a four-phase vertical transfer clock signal for driving the vertical transfer portion 6. The horizontal transfer portion 2 receives as an input a two-phase horizontal transfer clock signal for driving itself.

The horizontal transfer portion 2 and the vertical transfer portion 6 comprise a potential well of a minority carrier formed by introducing impurities to inside the semiconductor substrate on the surface side and a plurality of electrodes (transfer electrodes) formed repeatedly and separately on the substrate via a dielectric film. Above four-phase and two-phase transfer clock signal are cyclically dephased and applied to the transfer electrodes of the transfer portions 2 and 6. In the transfer portions 2 and 6, a potential distribution of the above potential well is successively changed by controlled by a transfer clock signal to be applied to the transfer electrodes, and charges in the potential well are transferred in the dephasing direction of the transfer clock signal. Thus, the transfer portions 2 and 6 function as so-called shift registers. Hereinafter, the vertical transfer portion will be referred to as a vertical transfer register and the horizontal transfer register will be referred to as a horizontal transfer register.

Figure 3:
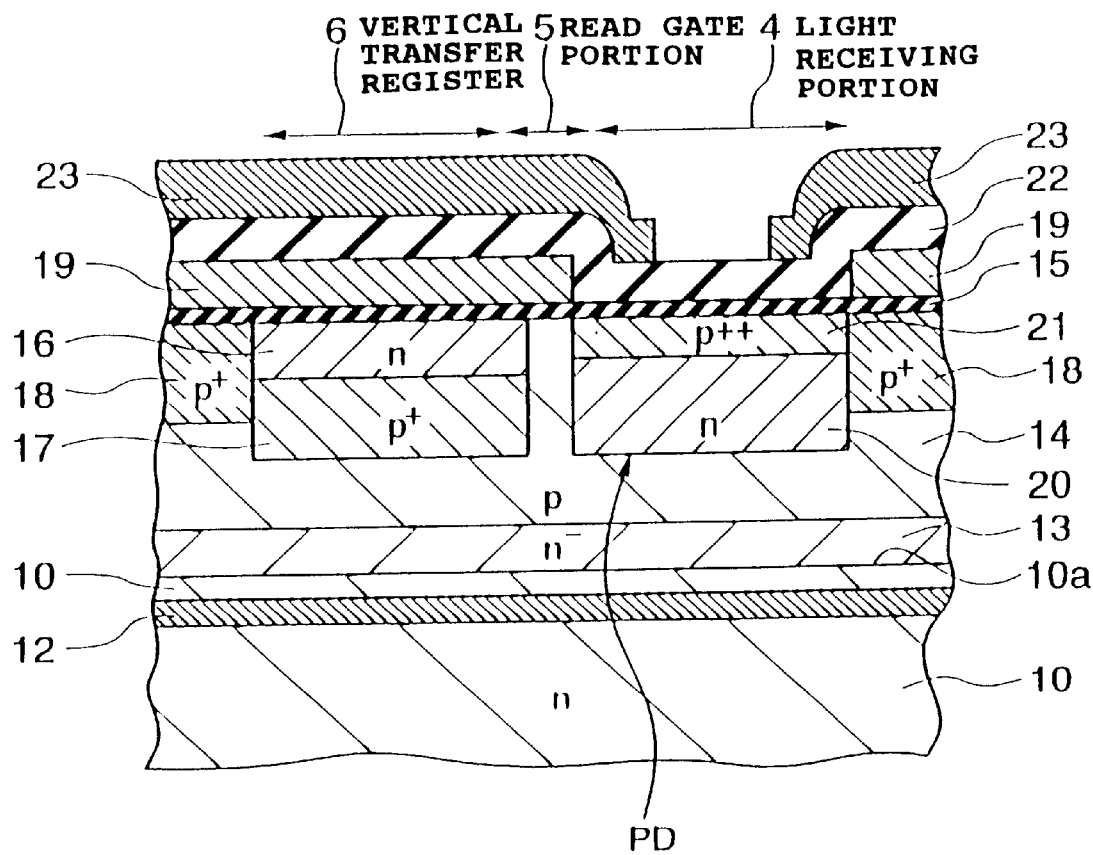
FIG. 3 is a sectional view in the horizontal direction along the line A—A in FIG. 2 of an amount of one pixel in the CCD according to the present embodiment.

FIG. 3 is a sectional view in the horizontal direction of an amount of one pixel along the line A—A in FIG. 2.

The CCD comprises an n-type silicon substrate 10, wherein carbon is introduced to inside the silicon substrate 10 on the mirror surface 10a side to form a buried getter sink layer 12. The buried getter sink layer 12 has a peak concentration of carbon at a position deeper than the mirror surface 10a of the silicon substrate 10.

On the mirror surface 10a of the silicon substrate 10 is formed a crystal growth layer 13 made by n⁻-type monocrystal silicon of a lower level than the silicon substrate 10. Also, a p-type well 14 is formed inside the crystal growth layer 13.

An n-type transfer channel region 16 for forming a potential well at the time of charge transfer is formed at a position corresponding to the vertical transfer register 6 inside the p-well 14. The n-type transfer channel region 16 lies longitudinally in the vertical transfer direction and is formed, for example, in a parallel stripe shape in the imaging portion 1 as a whole. A p-type concentrated impurity region 17 is formed on the deep portion side of the substrate in the n-type transfer channel region 16. The p-type concentrated impurity region 17 prevents charges generated on the substrate bulk side from flowing into the n-type transfer channel region 16, consequently, particularly smear is effectively prevented.

Note that other p-type impurity region may be also formed on the substrate surface side in the n-type transfer channel region 16 so as to make the transfer channel a buried type. In this case, pinning of signal charges by substrate surface states is prevented and vertical transfer efficiency improves.

At a position corresponding to the above light receiving portion 4 inside the p-type well 14 is formed an n-type impurity region (signal charge accumulation region) 20. Also, in the substrate surface side of the n-type impurity region 20 is formed a p-type impurity region (positive charge accumulation region) 21 to which positive charges are accumulated. Due to the above, a photo diode PD wherein a section in the substrate vertical direction has a P⁺-N-P configuration, a so-called HAD (Hole Accumulated Diode) sensor is formed. An incident light of the photo diode PD is subjected to photoelectric transfer to generate signal charges (electrons) and the signal charges are accumulated for a certain time inside the n-type impurity region 20. Also, when the incident light is intensified, excessive charges are overflowed from an OFB (Over Flow Barrier) formed by the p-type well 14 and disposed on the substrate side.

A channel stop region 18 made by a p-type concentrated impurity region is formed between the light receiving portion 4 and a vertical transfer portion (not shown) of other adjacent cell on the right side of FIG. 3 or between the above vertical transfer portion 6 and a light receiving portion (not shown) of other adjacent cell on the left side of FIG. 3. The channel stop region 18 extends to sides of other two sides not shown in FIG. 3 of impurity regions 20 and 21 composing the photo diode PD. Thereby, interference of signal charges between cells in the horizontal direction and vertical direction is effectively prevented.

A p-type well region positioned between an n-type transfer channel region 16 of the vertical transfer register 6 and an n-type impurity region 20 of the light receiving portion 4 become a read gate region. Note that a low level p-type impurity region for adjusting a height of a potential barrier of the read gate may be formed in this region.

Over the p-well 14 being formed the various impurity regions is covered with a dielectric film 15. The dielectric film 15 is illustrated as a single layer in FIG. 3, but actually, it is a dielectric film of three-layer structure comprising oxidized films (for example, silicon dioxide films) and a nitride film (for example, a silicon nitride film) having a charge accumulation ability sandwiched between the oxidized films those are formed on the vertical register 6 and read gate portion 5 and the channel stop region. It is for enabling to adjust anti-blooming characteristics by changing mainly a threshold voltage of the read gate portion.

Vertical transfer electrodes 19, for example, made by polycrystalline silicon are formed over the read gate portion 5, vertical transfer register 6 and channel stop region being formed the three-layered dielectric film 15. The vertical transfer electrodes 19 are, while not illustrated, repeatedly arranged in the vertical transfer direction with a part thereof superimposing on other vertical transfer electrodes made by other polycrystalline silicon layer. Also, the vertical transfer electrodes 19 function also as a control electrode of the read gate portion 5.

A surface of the vertical transfer electrodes 19 and a surface of the dielectric film 15 of the light receiving portion 4 are covered with an interlayer insulation film 22, for example, made by PSG, $SiO_2$, etc. A light blocking film 23 covering the upper and side surfaces of the vertical transfer electrodes 19 and opening on the light receiving portion 4 is formed on the interlayer insulation film 22. The light blocking film 23 is made by metal a material, such as Al and W.

Below, a method of producing the CCD will be explained with reference to FIG. 4 to FIG. 8.

Figure 5A:
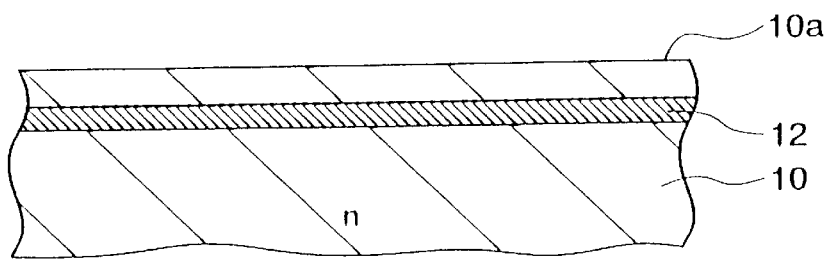
FIGS. 5A to 5C are sectional views of producing the CCD according to the present embodiment showing up to formation of a p-well.
Figure 5B:
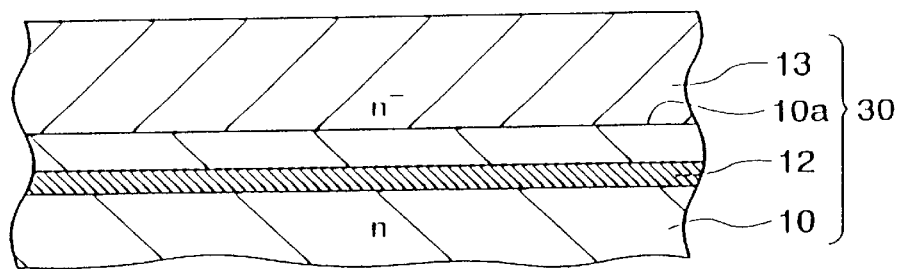
Figure 5C:
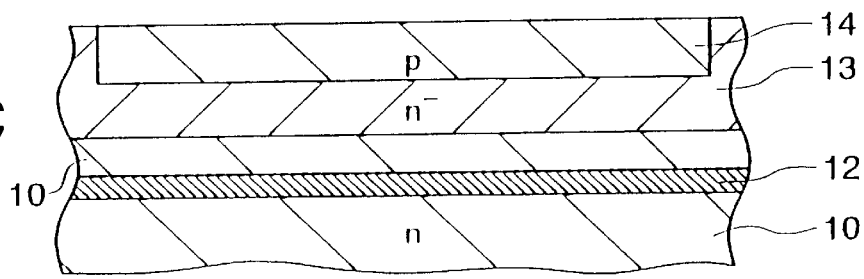
Figure 6:
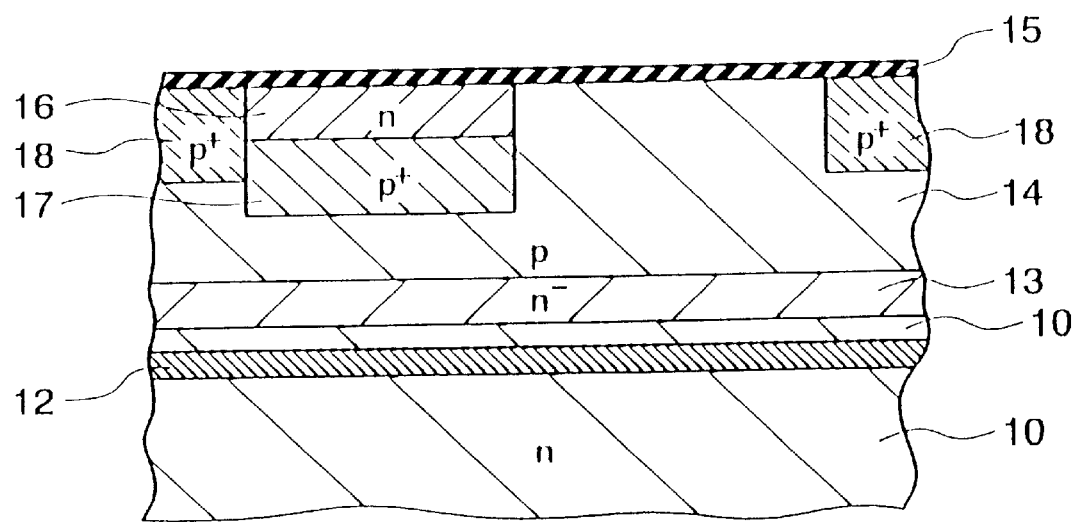
FIG. 6 is a sectional view in the horizontal transfer direction of an amount of one pixel showing after forming impurity regions in a vertical transfer portion and channel stop region in producing the CCD according to the present embodiment.
Figure 7:
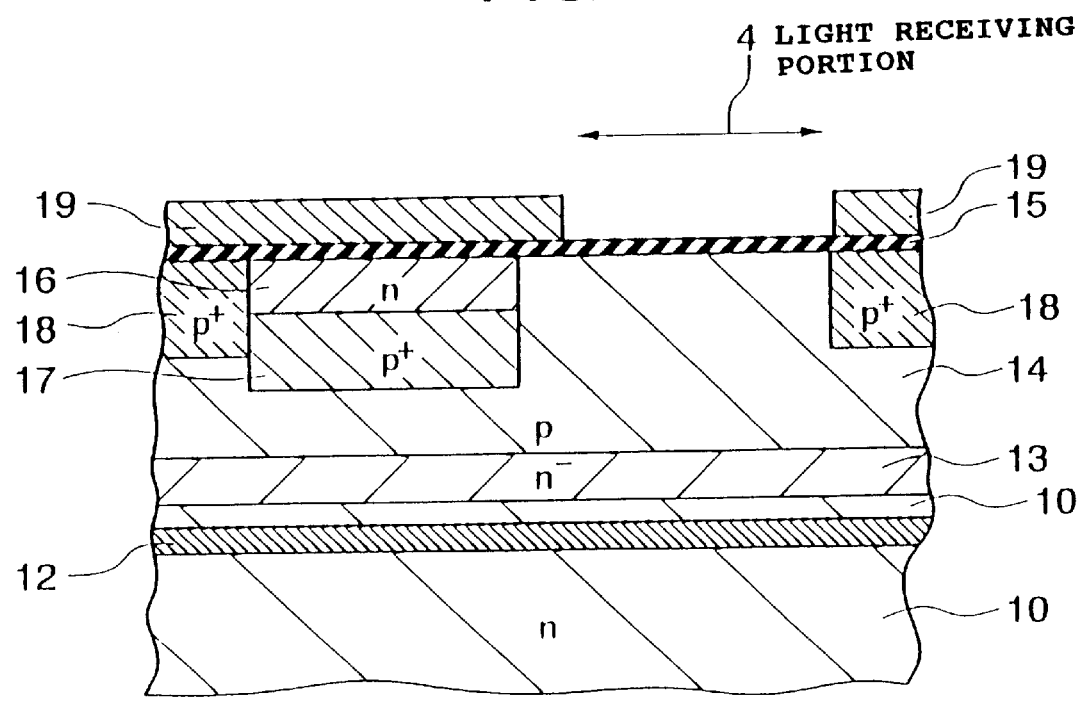
FIG. 7 is a sectional view in the horizontal transfer direction of an amount of one pixel showing after forming a vertical transfer electrode in producing the CCD according to the present embodiment.
Figure 8:
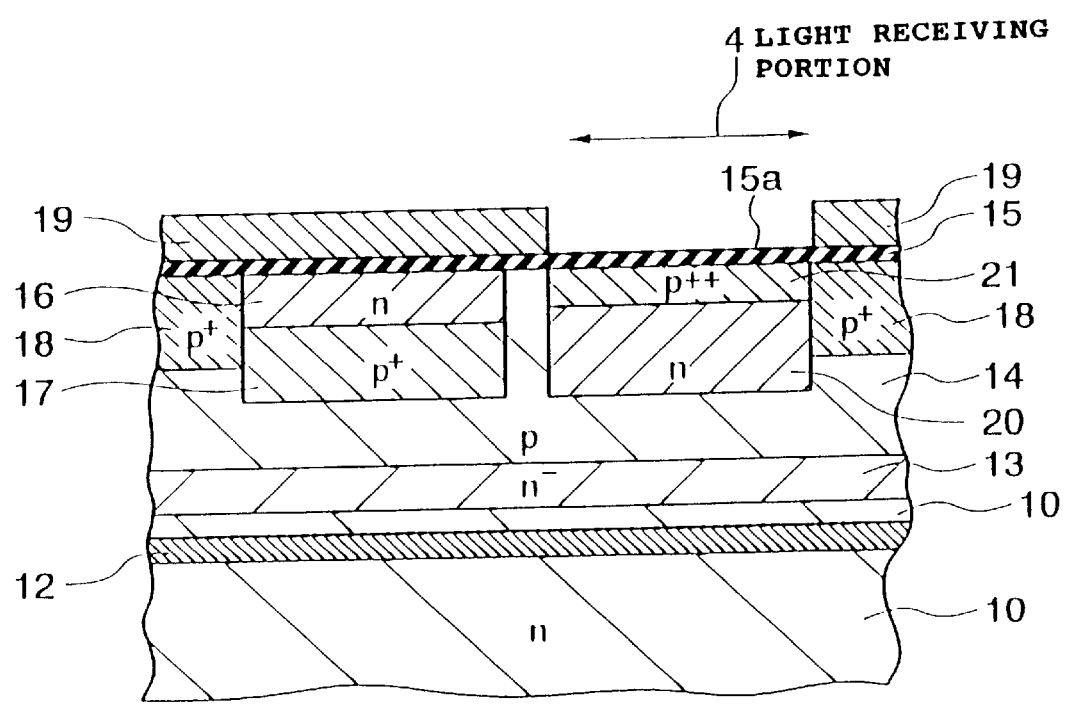
FIG. 8 is a sectional view in the horizontal transfer direction of an amount of one pixel showing after forming impurity regions of a light receiving portion in producing the CCD according to the present embodiment.

Here, FIG. 4 and FIG. 5 are sectional views corresponding to the whole light receiving portion, and FIG. 6 to FIG. 8 are enlarged sectional views in the horizontal transfer direction of a part corresponding to one pixel thereof.

Figure 4A:
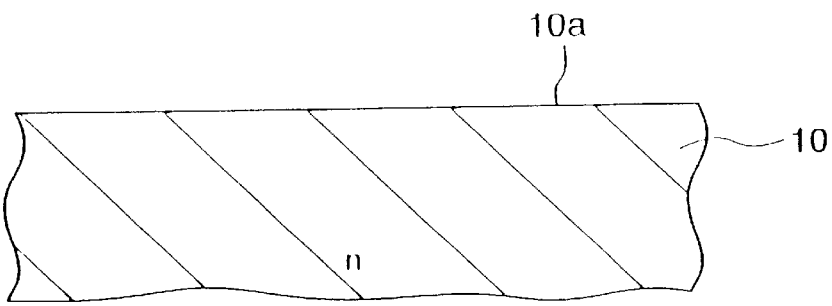
FIGS. 4A to 4C are sectional views of producing the CCD according to the present embodiment showing up to formation of a carbon implanted region (buried getter sink layer).

First, as shown in FIG. 4A, a silicon substrate 10 produced by the CZ method is prepared. Namely, a wafer is cut out from an ingot of silicon monocrystal grown by the CZ method and its main surface 10a is mirror-finished. The silicon substrate 10 has a main surface 10a of (100) planes and doped with phosphorous to have an n-type conductivity, and the resistivity there of is 10 Ω·cm. Here, a size of the silicon substrate 10 was made to be 8 inches in diameter.

Figure 4B:
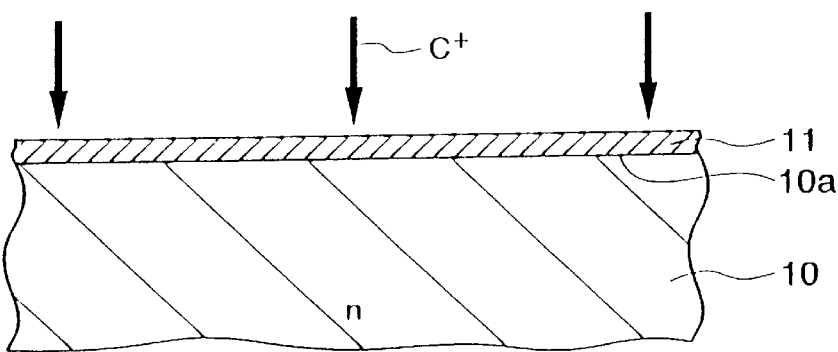

Next, as shown in FIG. 4B, a cleanup treatment is performed to the silicon substrate 10 by using a predetermined cleaning fluid containing hydrogen peroxide $H_2O_2$. Here, after cleanup treatment with a $NH_4OH/H_2O_2$ solution, further cleanup treatment with a $HCl/H_2O_2$ solution was performed.

Immediately after the cleaning, the surface of the silicon substrate 10 was dry oxidized, for example, at 1000° C. Thereby, a thermally-oxidized silicon film 11 having a thickness of 20 nm is formed on the surface 10a of the silicon substrate. By an ion implantation using the thermally-oxidized silicon film 11 as a through film, carbonate ion $C^+$ is implanted inside the silicon substrate 10 from the mirror surface 10a side. Conditions of the ion implantation at this time are, for example, accelerating energy of 160 keV, a doze of $1 \times 10^{15}$ ions/cm², a projected range of carbon of about 0.35 μm and a peak concentration of carbon of about $5 \times 10^{18}$ atoms/cm³.

Figure 4C:
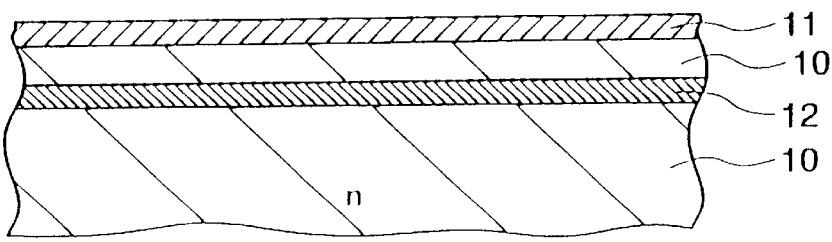

Then, annealing is performed at 1000° C. for 10 minutes in a nitrogen atmosphere. Thereby, as shown in FIG. 4C, a carbon implanted region 12 having a peak concentration at a position deeper than the mirror surface 10a of the silicon substrate 10 is formed.

The carbon implanted region 12 then becomes the "buried getter sink layer" in the present invention. Namely, at the time of the above annealing and later explained crystal growing of silicon, a compound is generated as a result that carbon introduced by the ion implantation bonds with over-saturated oxygen in lattice existing in advance in the CZ substrate, and thereafter, it functions as a getter sink.

Then, as shown in FIG. 5A, the thermally-oxidized silicon film 11 is removed by using a solution containing hydrofluoric acid (HF).

Next, as shown in FIG. 5B, a monocrystal silicon layer (silicon epitaxial layer) 13 having a thickness of 8 μm is grown by the CVD on the mirror surface 10a of the silicon substrate 10. The CVD of the silicon epitaxial layer 13 is performed by using $SiHCl_3$ as a source gas at 1100° C. or so. The silicon epitaxial layer 13 is made to be an n-type silicon layer doped with phosphorous and the resistivity is made to be 40 to 50 Ω·cm.

Note that the silicon epitaxial layer 13 of the present example was made thick to give the photo diode PD sensitivity to an infrared region, but it may be made thin when not giving high sensitivity.

From the above process, an epitaxial substrate 30 comprising the buried getter sink layer 12 and the silicon epitaxial layer 13 and having high gettering capability against contaminating substances inside the silicon epitaxial layer 13 is formed.

Here, the reason why the position of the peak concentration of the carbon implanted region 12 is made deeper than the surface is to prevent crystalline of the n-type epitaxial layer 13 from deteriorating.

Annealing in a nitrogen atmosphere after the ion implantation is performed on an object of accelerating bonding of carbon and oxygen and recovering crystalline near the mirror surface 10a which made to be amorphous due to the ion implantation. When heating at the time of crystal growing is sufficient for bonding carbon and oxygen performed before that, and when becoming amorphous does not matter due to conditions of ion implantation, the annealing is not always necessary.

Also, a doze of carbon is not limited to $1 \times 10^{15}$ ions/cm². It is confirmed that when a doze of carbon is $5 \times 10^{13}$ ions/cm² or more, white defects effectively reduce as a result of an improvement of gettering capability. Note that generally, when a doze of carbon exceeds a certain amount, for example, $5 \times 10^{15}$ ions/cm², crystalline of the mirror surface of the substrate declines and crystalline of the silicon epitaxial layer grown on the mirror surface also declines. Therefore, a range of $5 \times 10^{13}$ to $5 \times 10^{15}$ ions/cm² is preferable as a doze of carbon.

Furthermore, $SiHCl_3$ was used as a source gas for forming the above n-type silicon epitaxial layer 13, gases of $SiCl_4$, $SiH_2Cl_2$, $SiH_4$, etc. described above may be also used as the source gas.

The gettering capability can be furthermore heightened if nitrogen is added in advance to an ingot of silicon monocrystal before cutting out the CZ substrate. The getter sink is a compound of carbon and oxygen, wherein nitrogen is considered to accelerate deposition of oxygen. Also, in the case of adding nitrogen, the suitable range of a doze of carbon above is applied. As a specific method of adding nitrogen, powder of silicon nitride may be added at a certain ratio together with silicon chip into a quartz melting pot to be melted together by heating at the time of preparing a silicon solution used for forming an ingot of monocrystal silicon. Note that other than the method of melting nitrogen in advance into the substrate, the same effects can be obtained by ion implantation of nitrogen.

Also, when a content of oxygen is insufficient, the gettering capability is improved by performing ion implantation of oxygen in addition to that of carbon. In this case, it is confirmed that by making a doze of oxygen equal to a doze of carbon or more, the gettering capability improves.

As shown in FIG. 5C, a p-well 14 is formed on the surface layer in the n-type silicon epitaxial layer 13 of the thus formed substrate 30. The formation of the p-well 14 is carried out by selectively performing ion implantation of, for example, boron.

In FIG. 6, a dielectric film 15 is first formed on the surface of the n-type epitaxial layer 13 being formed the p-well 14. The dielectric film 15 is a stacked films (ONO film) of a silicon dioxide film, silicon nitride film and silicon dioxide film.

Next, a variety of impurity regions are formed on the p-well 14. Specifically, a mask layer of a predetermined pattern is formed on the dielectric film 15, and ion implantation of n-type and p-type impurities is performed from opening portions of the mask layer by using the dielectric film 15 as a through film under necessary conditions. By repeating the formation of the mask layer and the ion implantation, the n-type transfer channel region 16 and the p-type concentrated impurity region 17 thereunder, those are composing the vertical transfer register, and the p-type channel stop region 18 are respectively formed.

As shown in FIG. 7, the transfer electrodes 19 are formed on the dielectric film 15. When the transfer electrodes has two layers, the processing is performed in an order of stacking and patterning of a first polycrystal silicon, forming of an interlayer dielectric film, and stacking and patterning of a second polycrystal silicon.

As shown in FIG. 8, ion implantation of n-type impurity is performed to form an n-type impurity region 20 on the light receiving portion 4. Also, ion implantation of p-type impurity is performed to form a positive charge accumulation region 21 as an upper layer thereof. The ion implantation may be performed with the ONO film (dielectric film) 15 remained thereon, or by removing the ONO film of the light receiving portion 4 by using the transfer electrodes 19 as masks prior to the ion implantation, forming a single layer silicon dioxide film again on the light receiving portion 4, and using the single layer silicon dioxide film as a through film. Alternately, the ion implantation may be performed with the silicon dioxide film as the lowermost layer of the ONO film remained.

In any cases, after the ion implantation, it is preferable to remove the dielectric film of the light receiving portion 4 and place a single layer silicon dioxide film 15a again. Although contaminating substances of heavy metal, etc. are implanted with impurities to be implanted from an ion implantation apparatus, most of those are trapped in the through film immediately after the ion implantation. If the contaminated film is remained till the end, there is a possibility that the contaminating substances disperse in the photo diode PD of the light receiving portion 4 in thermal processing thereafter. Contaminating substances introduced after this is hard to be gettered and liable to remain till the end to become a factor of declining characteristics. It is preferable to remove the through film used at the time of the ion implantation by any of the above explained processes in order to prevent introduction of the contaminating substances itself.

Then, activation annealing is performed if necessary.

Also, as shown in FIG. 3, an interlayer insulation film 22, for example, made by PSG or Sio$_2$ is stacked on the transfer electrodes 19 and the dielectric film 15 of the light receiving portion 4. Also, a metal film to be a light blocking film 23 is formed on the interlayer insulation film 22 and patterned to be opened above the light receiving portion 4.

Furthermore, in accordance with need, an interlayer insulation film, inlayer concave lens, color filters and OCL (On Chip Lens) are formed to complete the CCD.

The production method of the CCD is characterized in that high temperature processing which reduces gettering effects of the buried getter sink layer 12 is not performed after forming the silicon epitaxial layer 13. Specifically, a process requiring heating of 1100° C. or more appears for the last time for the silicon epitaxial layer 13 and not in processes thereafter in the example above.

In the production processes of the CCD, other than the formation of the silicon epitaxial layer 13, a process requiring a high temperature of 1100° C. or more exists in processes of two kinds of extrinsic gettering (EG) called "P (phosphorous) gettering" and "HCL oxidization". In the "P (phosphorous) gettering", high temperature processing of 1100° C. is required in a thermal diffusion process at the time of forming a concentrated phosphorous diffusion region on a back surface of the silicon substrate 10. While, in the "HCL oxidization", after forming the silicon epitaxial layer 13, HCL oxidization including high temperature processing on its surface in an atmosphere of a gas containing hydrochloric acid is performed. Due to the gettering effect by hydrochloric acid, crystallinity of a surface region on which an element is formed is improved in the silicon epitaxial layer 13, a dark-current is reduced and white defects are reduced.

Since the P gettering or the HCL oxidization alone exhibits gettering effects, respectively, it has been conventionally considered that "it is preferable to apply both of gettering by carbon introduction and other extrinsic gettering to attain comprehensively high gettering effects".

However, according to a result of an experiment carried out by the present inventors through the present invention, it revealed to be clear for the first time that there is an upper limit for a heating temperature to make the best use of the gettering effects by carbon introduction.

FIG. 9 is a graph of the result of the experiment.

FIG. 9 shows dependency of the number of white defects on the highest temperature of a process of forming an element when assuming the number of white defects of a wafer wherein carbon is not implanted is 100. Three conditions were made for the highest temperature of the process of forming an element: a conventional case where the gettering method of carbon implantation and other extrinsic gettering method were both used (the highest temperature of the process was 1100° C.), a case where the other extrinsic gettering method is omitted and the highest temperature of the process was regulated to 1050° C., and a case where the highest temperature of the process was lowered to 1000° C. Two wafers were prepared for each of the conditions, evaluation of white defects was made on each device inside the wafers after producing CCD under respective conditions, and an average value of each wafer was calculated to plot.

Note that the evaluation of white defects was made by measuring a charge amount (a dark-current amount) of an OB (Optical Black) portion in the horizontal direction and those having a level exceeding a standard were defined as color mixture defects. It is because the degree of color mixture of pixels strongly depends on a dark-current amount.

From the graph, it is understood that the number of white defects decreases as the highest temperature of a process of forming an element lowers. It is expected that occurrence of white defects will be almost eliminated when the highest temperature of the process of forming an element is made further lower.

Note that the highest temperatures of the process of forming an element of 1050° C. and 1000° C. involve changes of an optimized temperature in its process, such as a thermal oxidization process, so when the temperature is easily changed without precise consideration, other element parameters may be also changed. However, since the temperature application of 1100° C. is gettering by the P gettering or HCL oxidization, it can be concluded that an extrinsic gettering process is unnecessary from the experiment result of decreased white defects.

Actually, it was confirmed as a result of examining various characteristics of CCD devices on which only gettering of carbon implantation was performed, white defects were improved without declining other characteristics.

From the above experiment results, it was understood that a method of producing the CCD of the present embodiment gave an effect of improving white defects at least when an element was formed at a lower temperature than the processing temperature of the P gettering or HCL oxidization.

Alternately, from a different point of view, it can also be concluded that since the temperature of forming the epitaxial layer is the same 1100° C. in the above example, effects of improving white defects can be obtained by forming an element at a lower temperature than this. It is because when a getter sink is formed mainly at the time of forming the epitaxial layer, it is quite forecastable that the upper limit of the highest temperature of the process changes in accordance with the temperature.

According to a method of producing a CCD of the present embodiment, by regulating the upper limit of the highest temperature of a process of forming an element as above, gettering effects by carbon implantation can be fully brought out to widely reduce a dark-current. As a result, the number of white defects can be reduced to ⅓ or so at maximum comparing with a conventional production method wherein the highest temperature of the process of forming an element was 1100° C.

Note that the embodiment of a method of producing a solid-state imaging device of the present invention is not limited to the above explanation. For example, in the above embodiment, an n-type impurity region was formed on the surface of the p-well formed on the n-type silicon epitaxial substrate, and a photo diode is formed by pn-junction of the p-well and the n-type impurity region, but the present invention can be applied to a solid-state imaging device comprising a photo diode of a different configuration.

Specifically, the present invention can be applied to a case of producing a photo diode by forming an n-type impurity region on the p-type silicon epitaxial substrate. Also, the present invention can be also applied to production of solid-state imaging devices other than CCD, such as an amplifying type solid-state imaging device and CMOS type solid-state imaging device, to effectively reduce a dark-current.

Furthermore, an element to be implanted to the buried getter sink layer is not limited to carbon and may be a congener of a semiconductor element of the substrate, such as germanium Ge, tin Sn or lead Pb. Other than the above, a variety of modification can be made within the scope of the present invention.

According to a method of producing a solid-state imaging device of the present invention, gettering capability of a substrate provided with a buried getter sink layer can be sufficiently brought out in the process of forming an element thereafter. As a result, a dark-current caused by contaminating impurities in a crystal growth layer is reduced, white defects is reduced in an evaluation of the solid-state imaging device, and the yield is improved.

What is claimed is:

1. A method of producing a solid-state imaging device, including the steps of:

forming a buried getter sink layer by introducing to the semiconductor substrate a substance of a second element which is a congener of a first element composing a semiconductor substrate;

forming a crystal growth layer by crystal growing the substance of the first element on a surface of said semiconductor substrate; and forming a solid-state imaging element inside and on said crystal growth layer at a lower temperature than that in the case of forming the buried getter sink layer by introducing a substance of a third element of a different group from said first element to a back surface of said semiconductor substrate.

2. A method of producing a solid-state imaging device as set forth in claim 1, wherein a temperature of all processes to form said solid-state imaging element is lower than 1100° C.

3. A method of producing a solid-state imaging device as set forth in claim 1, wherein said first element is silicon and said second element is carbon.

4. A method of producing a solid-state imaging device as set forth in claim 1, wherein said third element is phosphorous.

5. A method of producing a solid-state imaging device, including the steps of:

forming a buried getter sink layer by introducing to the semiconductor substrate a substance of a second element which is a congener of a first element composing a semiconductor substrate;

forming a crystal growth layer by crystal growing the substance of the first element of a surface of said semiconductor substrate; and forming a solid-state imaging element in and on said crystal growth layer at a lower temperature than that in the case of forming an extrinsic getter sink layer on a surface of said crystal growth layer by oxidization in an atmosphere of a gas containing hydrochloric acid.

6. A method of producing a solid-state imaging device as set forth in claim 5, wherein a temperature of all processes to form said solid-state imaging element is lower than 1100° C.

7. A method of producing a solid-state imaging device as set forth in claim 5, wherein said first element is silicon and said second element is carbon.

* * * * *